United States Patent [19]
Lin

[11] Patent Number: 4,494,069
[45] Date of Patent: Jan. 15, 1985

[54] OPTICAL SCANNING METHOD OF TESTING MATERIAL DEFECTS

[76] Inventor: Hung C. Lin, 8 Schindler Ct., Silver Spring, Md. 20903

[21] Appl. No.: 302,150

[22] Filed: Sep. 14, 1981

[51] Int. Cl.³ .............................................. G01R 1/06
[52] U.S. Cl. ............................ 324/158 R; 324/158 P
[58] Field of Search ........................ 324/158 R, 158 P

[56] References Cited

PUBLICATIONS

"End-Point Detection for Reactive Ion Etching", in IBM Tech. Disc., vol. 20, No. 2, Jul. 1977 by Geipel, pp. 541-542.

"Probe for MOS Measurements", in IBM Tech. Disc., vol. 13, No. 10, Mar. 1971, pp. 2981-2982, by Hoekstra.

Primary Examiner—Stewart J. Levy

[57] ABSTRACT

A method of testing material defects utilizing photovoltaic effect. A detachable, transparent probe coated with either transparent metal or semiconductor is placed in contact with the material under test. The contact forms either a Schottky barrier or a p-n junction. A light spot scanning the material produces photo currents which is sensed. Defects cause a reduction in photo current.

11 Claims, 5 Drawing Figures

OPTICAL SCANNING METHOD OF TESTING MATERIAL DEFECTS

BACKGROUND OF THE INVENTION

The present invention is related to a method of testing defects in material, particularly, semiconductor material.

Semiconductor is widely used in modern electronic devices such as transistors, silicon control rectifiers, integrated circuits, solar cells etc. In large area devices, the quality of the semiconductor material is very important for the yield in production. Any defects in the material whether originally grown in the crystal or induced during processing can cause the device to malfunction. It is important to inspect the material before costly processing the device. Also if any defect is introduced during processing, the particular semiconductor wafer should be discarded from further processing.

Visual inspection of the semiconductor wafer is often inadequate, because defects may be hidden beneath the surface. Besides, visual defect may not be correlated to semiconductor electrical properties such as lifetime, diffusion lengths, etc. which are important to device characteristics.

Photo response using a scanning light has been used to inspect the semiconductor wafers. Photo response results from photovoltaic effect. However, photo response can only be effected with a p-n junction or a Schottky barrier. Unfortunately, after the p-n junction is formed, the junction becomes a permanent part of the structure and cannot be removed.

If Schottky barriers are used, a metal must be deposited on the wafer, which must be removed subsequently. Besides, a metal generally has poor optical transmission, which reduces the sensitivity of the measurement. Thus, the extra processing steps and the poor optical transmission make this scheme unattractive.

What is needed is a method of inspecting a semiconductor wafer which is nondestructive and does not add any processing steps.

SUMMARY OF THE INVENTION

An object of the present invention is to devise a method to inspect the defect of material, particularly semiconductor material.

Another object of this invention is to devise a method to inspect the defects of material nondestructively.

Still another object of this invention is to devise a method to inspect the defects of material without introducing additional processing steps.

The above objects are achieved in this present invention by using a detachable, transparent probe in contact with the material under test. This transparent probe is coated with a thin transparent film. The film can be either semiconducting or metallic.

In the case of a semiconducting film, the probe forms a p-n junction with the semiconductor wafer under test. For the case of a metallic film, the probe forms a Schottky barrier with the semiconducting wafer under test. A small light spot transmits through the transparent probe and scans the semiconductor wafer. A current is generated by photovoltaic effect. Any defect in the wafer causes the current to be irregular on a current map.

The details of the method and devices fabricated thereby are set forth in the description of the drawings.

DETAILED DESCRIPTION OF THE PREFERRED EMBODIMENT

Figure 1:
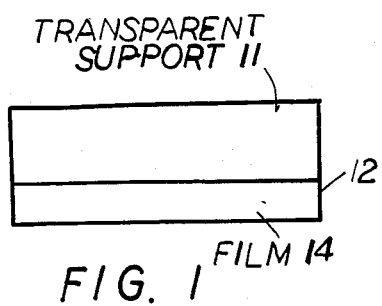
FIG. 1 is a cross-section of a probe in accordance with the present invention.

Referring to the drawings, FIG. 1 is a schematic cross-section of a probe fabricated by the present invention.

The drawing comprises a transparent support 11. This transparent support 11 is coated with a thin film 12. In one embodiment, this film is made of transparent metal which can form a Schottky barrier when surface 14 is in contact with semiconductor. The choice of the metal depends on the semiconductor type under test. For p-type semiconductor a lower work function metal such as aluminum, titanium, etc., should be used. The metal should preferably have good optical transmission properties. Since titanium has better optical transmission than aluminum, titanium is preferred over aluminum. For n-type semiconductor, the metal should be of higher work function, such as gold, nickel, etc.

Schottky barrier can also be formed with certain kinds of conducting oxide such as tin oxide. This kind of oxide is electrically conducting and transparent to optical light. The oxide can also be doped to effectively adjust its work function. For instance, an indium or gallium doped tin oxide can form a rectifying Schottky barrier with n-type semiconductor. An arsenic or antimony doped tin oxide can form a rectifying Schottky barrier with p-type semiconductor. Such tin oxide Schottky barriers are well known in the art.

Another embodiment of the mode is to coat the entire oxide as film 12 on the transparent probe 11.

Figure 2:
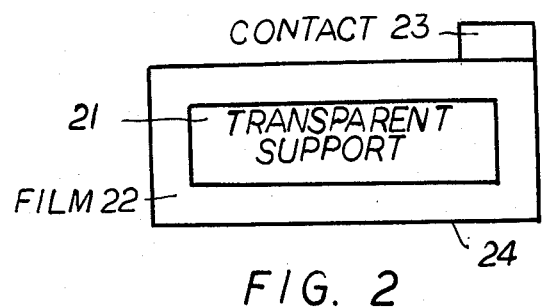
FIG. 2 is a cross section of another version of a probe in accordance with the present invention.

Another version of this invention is to coat the entire transparent support with either thin metal or transparent conducting material, instead of a single face as shown in FIG. 1. The cross-section view is shown in FIG. 2. In this version, the transparent support 21 is coated with a film 22. This film can be made of either (a) thin metal or (b) conducting transparent oxide. This construction has the flexibility that the contact to the film can be made at any side of the structure. As shown in FIG. 2, ohmic contact 23 is made on the top side of the probe. The bottom side 24 can then lay flat on the material under test.

For a p-n junction probe, the material for FIG. 1 should be changed. Now the film 12 should be of semiconductor. The conductivity type should be opposite to that of the material under test for high photovoltaic efficiency, the semiconductor film 12 should be crystalline in structure. To grow single crystal film on a support, one should match the lattice structure of the film 11 and the support 12. It is well known in semiconductor art that silicon film can be grown on a sapphire substrate. Such a material is known as a silicon-on-sapphire or SOS structure. The silicon film can be doped either p-type or n-type. Since silicon does not transmit light well, the silicon film should be very thin. Commercially available films usually are grown to a thickness of less than one micrometer. Such a thin layer can permit enough light to penetrate through the silicon film. Sapphire is transparent to visible light and is therefore a good material for the support 11 in FIG. 1.

The SOS probe can be used to test either semiconductor or metal material. For testing metal material, the semiconductor conductivity-type should be chosen to constitute a Schottky barrier with the metal under test. Then photovoltaic effect can take place.

Figure 3:
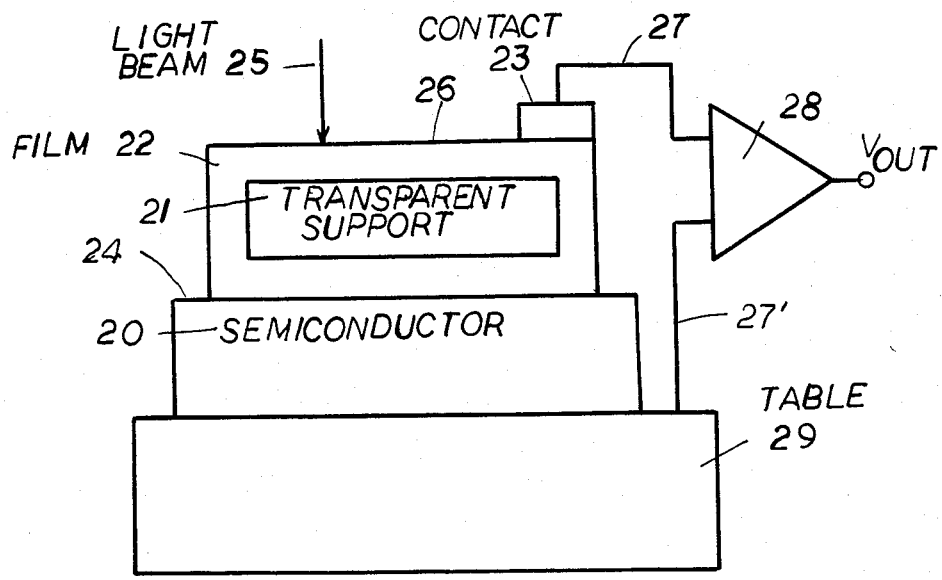
FIG. 3 is a test setup of a light scanning system in accordance with the present invention.

The test setup of the present invention is shown in FIG. 3. The probe as described in FIG. 1 or FIG. 2 is placed on the flat surface of material 20 under test. If the material under test is a p-type semiconductor, the film of the probe should be either of a lower work function metal to form a Schottky barrier, or of n-type semiconductor to form a p-n junction. A light beam 25 of small spot size (preferably less than a diffusion length, e.g. 10 micrometer) is incident on the top side 26 of the probe. This light beam excites the semiconductor 20 under test. Holes and electrons generated within a diffusion length of the barrier can cross the Schottky barrier or the junction and produce a photo voltage. This photovoltage can cause an external current to flow. In FIG. 3, the photo current is sensed through connections 27 and 27' by an operational amplifier 28, which in turn can derive an output volt to drive an x-y recorder, an oscilloscope or a meter.

The light beam 25 is made to scan the wafer under test. The scanning can be accomplished by moving the table 29 holding the sample 20 under test or by moving the light spot 25 relative to the sample.

A plot of output current corresponds to the photo current generated at the various positions of the scan. If the light beam scans the wafer in the horizontal direction repetitively and the vertical position is displaced successively, then the light beam can scan the whole area of the wafer. The output will appear on an x-y recorder or on an oscilloscope as rasters.

Figure 4:
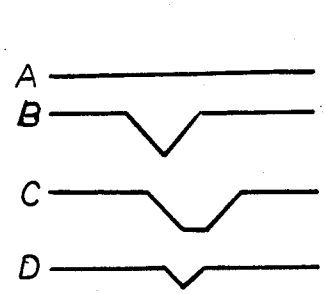
FIG. 4 shows the output rasters when a defective material is tested in a setup as shown in FIG. 3.

If there is no defect in the material, the output is uniform and displays a horizontal line such as line A in FIG. 4. If the scanning light encounters a defect, the photo response will decrease because a defect reduces the diffusion length which in turn reduces the photo current. As a result, the output may display an output such as lines B,C and D. The exact shape depends on the size of the defect and the effective diffusion length at the defect site relative to the rest of the material.

If the wafer under test is not flat, the probe and the wafer may not be in intimate contact uniformly over the entire area. The photo response will be reduced where the contact is not intimate. Thus, the probe can also be used to measure the flatness of the wafer.

If the wafer under test is nominally nonplanar in shape, the probe should then be made to conform with the surface of the material under test. This is possible if the probe is made flexible or of liquid. It is conceivable that the support 11 for metallic film 12 in FIG. 1 can be made with a transparent putty or air bubble.

Figure 5:
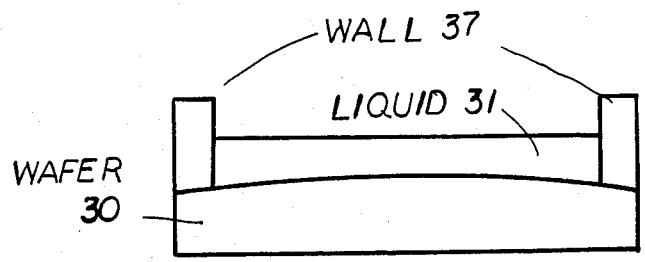
FIG. 5 shows a probe for testing nonplanar surface using liquid as one electrode.

If the probe is made of conducting, transparent liquid, a wall should be erected around the wafer to contain the liquid. FIG. 5 shows a possible scheme. A wafer 30 is under test. A wall 37 is erected on top and around the wafer. The wall may be glued on, waxed on or pressed on. A transparent conducting liquid 31 is poured inside the wall. This transparent liquid can act as a metal and form a Schottky barrier with the semiconductor 30 under test.

What is claimed:

1. A method of detecting defects in a material comprising the steps of placing an at least partially transparent probe on said material, said probe forming a potential barrier with said material, scanning a light spot over said probe, producing a photovoltaic effect where said light spot is incident, sensing said photovoltaic effect corresponding to said light spot position.

2. A method of detecting defects in a material as defined in claim 1, wherein said material in semiconductor.

3. A method of detecting defects in a material as defined in claim 1, wherein said probe is made of a transparent support coated with a thin film.

4. A method of detecting defects in a material as defined in claim 3, wherein said material is semiconductor, and said film is metal.

5. A method of detecting defects in material as defined in claim 4, wherein said semiconductor is p-type and said metal is of lower work function than said semiconductor.

6. A method of detecting defects in material as defined in claim 4, wherein said semiconductor is n-type and said metal is of higher work function than said semiconductor.

7. A method of detecting defects in material as defined in claim 2, wherein said probe is coated with a semiconductor film.

8. A method of detecting defects in material as defined in claim 7, wherein said film is of opposite conductivity type as said semiconductor material.

9. A method of detecting defects in material as defined in claim 3, wherein said material is metal and said film is semiconductor.

10. A method of detecting defects in material as defined in claim 3, wherein said probe is flexible and conforms with the surface of said material.

11. A method of detecting defects in material as defined in claim 3, wherein said material is semiconductor and said film is tin oxide.

* * * * *